United States Patent [19]
Ikeda

[11] Patent Number: 4,563,658
[45] Date of Patent: Jan. 7, 1986

[54] NOISE FILTER
[76] Inventor: Takeshi Ikeda, 5-6-213 Sanno-2, Ohta-ku, Tokyo 143, Japan
[21] Appl. No.: 611,498
[22] Filed: May 17, 1984
[30] Foreign Application Priority Data May 18, 1983 [JP] Japan ................... 58-85925
Jul. 25, 1983 [JP] Japan ................... 58-134377

[51] Int. Cl.⁴ .......................... H03H 7/01; H03H 7/09
[52] U.S. Cl. .................... 333/181; 29/602 R; 333/184; 333/185
[58] Field of Search ............................. 333/181–185, 333/167, 168, 175–180, 202, 12; 361/301–319; 29/592, 602 R, 605, 606, 609

[56] References Cited
U.S. PATENT DOCUMENTS

2,000,441  5/1935  Given ................... 333/184
2,260,296  10/1941  Christopher et al. ................ 333/184
3,141,145  7/1964  Barrett ................................ 333/184

Primary Examiner—Marvin L. Nussbaum
Attorney, Agent, or Firm—Allston L. Jones

[57] ABSTRACT

A three or four terminal noise filter and a method of making the same is disclosed. A pair of conductive bands are wound in a spiral manner with a thin insulating separator therebetween. The first conductive band is made of either electrically or electromagnetically conductive foil to form an inductance between terminals coupled to both ends of such foil. The first conductive band also provides capacitance distributed over its entire length between itself and the second conductive band. The second conductive band is made of electromagnetically conductive foil, such as an iron foil. The noise filter can be made by rolling the sandwich of conductive bands and insulators longitudinally.

9 Claims, 11 Drawing Figures

NOISE FILTER

BACKGROUND OF THE INVENTION

This invention pertains generally to a noise filter, more specifically to a filter particularly suited for suppressing noise and ripple components in power supply and smoothing circuits.

Noise filters are generally used for preventing malfunctions of electronic equipment by noise transmitted thereto on the power bus superimposed on its power voltage or current, and for suppressing any noise generated on a signal to be transmitted from one piece of equipment to another or to a power supply.

Figure 1:
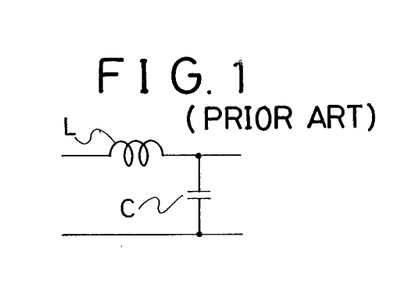
FIG. 1 is a basic prior art circuit of a conventional noise filter comprising a discrete inductor and capacitor.

Hitherto, noise filters having an inductor (L) connected in series with a power supply and a shunt capacitor (C), as shown in FIG. 1, have been widely used for the above purposes.

Figure 2A:
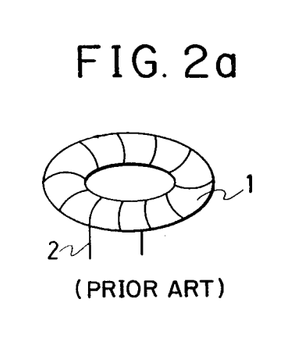
FIGS. 2a and b are two typical prior art inductors for use in the conventional noise filter of FIG. 1.
Figure 2B:
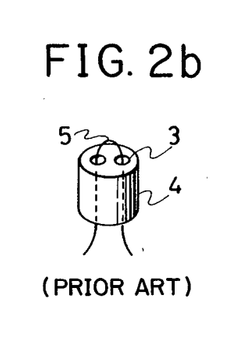

The inductor (L) for use in such noise filter circuits has taken various forms including coils (2) wound on a magnetic core (1), such as a toroidal type ferrite core or a dust core as shown in FIG. 2(a), and conductive wire (5) passing through holes (3) in a bead magnetic core (4) as shown in FIG. 2(b).

A major problem associated with the manufacture of such noise filters is the high production cost of the inductor (L). The pressing and heating processes in the manufacturing of the magnetic core, and the winding of the coil, in addition to the connection of the capacitor (C) with the inductor (L) are particularly cost intensive.

Many attempts have been made to reduce the costs and to thus provide less expensive noise filters. One approach is to integrate both inductive and capacitive elements into a single device which does not require a magnetic core. Japanese laid open patent (Kokai) number 9764/77 to M. Kakutani et al. shows a power supply noise filter made of a metal foil wound in a spiral manner with a pair of lead wires connected at both ends to form the inductor (L). Additionally, another metal foil is laminated with the first mentioned metal foil with an insulting separator therebetween to form the shunt capacitance. Also shown in Japanese utility model publication No. 24900/80 to H. Nakamura et al. is an improvement of such metal foil spiral inductor, namely the addition of external inductors to provide a bypass of DC signal components. These two prior art embodiments address some of the problems associated with the conventional noise filters which include discrete inductors and capacitors, however, they produce a filter having relatively low inductance.

Japanese laid open patent (Kokai) No. 21810/82 to T. Sato et al. discloses a technique to increase the spiral inductance by coating magnetic powder on one or both surfaces of the insulative film. However, this technique requires additional processing and is more expensive than the prior art noise filters.

It is desirable to have a noise filter which is as easy to construct as the wound foil filters with sufficient inductance so that it is not necessary to add external inductors or to employ an expensive wire coating process as in the prior art. The present invention provides such a noise filter.

SUMMARY OF THE INVENTION

Noise filters according to the present invention provide a larger inductance than the prior art with a comparable size of conductive foil. This is accomplished by using an electromagnetically conductive film or foil as at least one of the two metal films which make up the filter with an insulating separator between them. The electromagnetically conductive film used in the present invention can be any thin material which is a good conductor to electric current and magnetic flux. In other words, the electromagnetically conductive film is one that has both a high permeability and good electrical conductivity. The electrically conductive film is placed in close proximity to an electrically or electromagnetically conductive film over its entire length resulting in the inductance of the spirally wound conductor being significantly increased over the prior art devices. Thus, the required inductance is provided without the use of a magnetic core or the winding of an undesirably long film while forming a distributed capacitance over the entire length of the films.

It is therefore the primary object of this invention to provide a compact noise filter including a series inductance and shunt capacitance integrated into a generally tubular form without using a magnetic core.

It is another object of this invention to provide a noise filter that can be fabricated essentially in the same manner and in the same production facility as a tubular capacitor.

It is yet another object of this invention to provide a noise filter with excellent noise suppression characteristics over a wide frequency range.

It is still another object of this invention to provide a noise filter requiring a smaller number of turns for the winding of the inductor.

It is an additional object of this invention to provide a noise filter that is simpler and less expensive to manufacture.

These and other objects of this invention along with its operation and other advantages will best be understood from the following description of the preferred embodiments and by reference to the accompanying drawings.

DETAILED DESCRIPTION OF THE PREFERRED EMBODIMENTS

Figure 3:
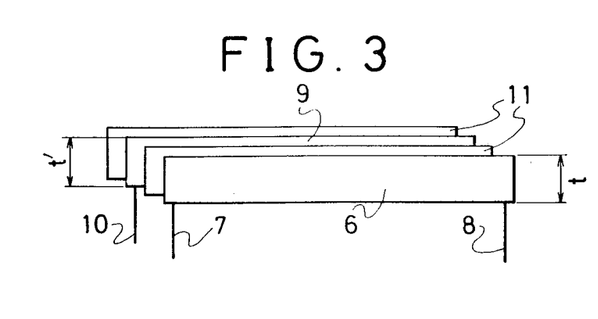
FIG. 3 is a view of the arrangement of the constituent parts of the present invention before they are wound longitudinally.
Figure 4:
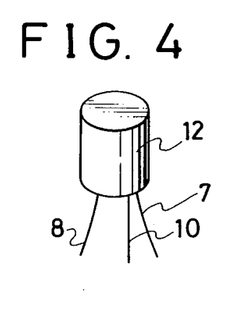
FIG. 4 is a perspective view of a tubular noise filter according to the present invention in its final assembled configuration.

Referring now to FIG. 3 there is shown an expanded, unwound, view of the noise filter according to the present invention. The filter includes several rectangularly shaped elements stacked adjacent one another. The various layers include a band 6 of a highly electrically conductive material, such as copper or aluminum foil, with lead wires 7 and 8 connected substantially at opposite ends thereof. Another band 9 of an electromagnetically conductive material, such as a thin sheet of iron, amorphous iron, mumetal or similar material includes a lead wire 10 coupled substantially at one end thereof. Band 9 is disposed in superimposed relation to electrically conductive band 6 with an insulating band 11, such as a mylar or a capacitor paper, on both sides of at least band 9. A stable iron sheet or film with uniform thickness for band 9 is available from Toyo Kohan Co., Ltd. and is referred to as galvanized electrodeposited iron foil (I.F.) in their literature. It should be noted, however, that the electrically conductive film for band 6 may be other than iron as long as it exhibits excellent magnetic and electric conduction characteristics. The sandwich of bands 6, 9 and 11 are then integrally wound longitudinally into a tubular form with the insulating band 11 furthest from band 6 on the outside. The wound noise filter is then inserted into can 12 as shown in FIG. 4. This then provides a noise filter with its capacitance distributed over the entire length of the coil. The entire noise filter may be pressed into an oval cross section before coating with protective material.

The noise filter in can 12 thus includes a coil of electrically conductive band 6 between a pair of lead wires 7 and 8 and capacitance distributed between electrically conductive band 6 and electromagnetically conductive band 9 over the entire length of the band 6. The electromagnetically conductive band 9, in addition, performs the function of the core for the inductor of the filter, with band 9 sandwiched between electrically conductive band 6 and the insulation spacer 11 therebetween, to increase the inductance of the coil. The conductive bands 6 and 9 may be provided directly on the respective insulative bands 11 by vapor deposition, non-electrolitic plating, sputtering or by another technique known in the art, thereby further miniaturizing the noise filter of the present invention. Additionally, the inductive coupling between bands 6 and 9 aids the provision of better noise suppression. Larger inductance results if the width, t, of band 6 is chosen to be smaller than the width, t', of band 9, thereby effectively burying band 6 when wound in a tubular form.

Another embodiment of the present invention utilizes electromagnetically conductive bands, such as iron films, for both bands 6 and 9 (FIG. 3). This embodiment is essentially the same as the first embodiment except for the change of the material of band 6. As is understood from the description hereinafter, however, electrical performance of the second embodiment is a further improvement over the prior art.

Noise suppression characteristic curves or frequency attenuation ratio characteristic curves of the noise filters according to the invention are described hereinbelow in comparison with those of conventional noise filters.

Figure 5:
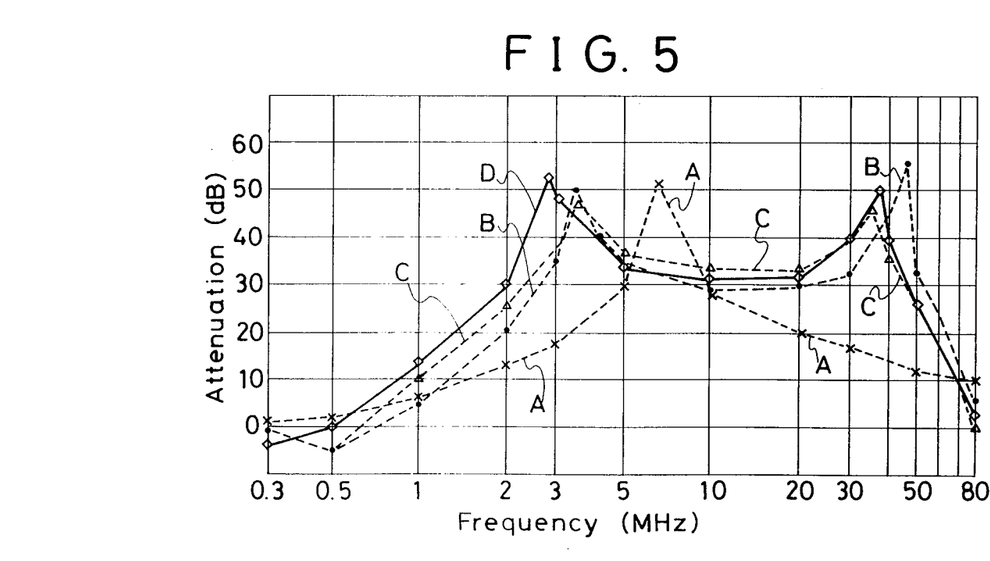
FIGS. 5 through 8 are attenuation characteristic curves of different samples of the various embodiments of the noise filter according to the present invention in comparison with the same characteristics of prior art noise filters.

FIG. 5 shows four attenuation characteristic curves (in dB) versus frequency (MHz) for various noise filters in accordance with the test scheme of Japanese Industrial Standard (JIS-c6904-1977) for suppression effect test circuits to a symmetrical noise signal voltage with the circuit terminated into a 50 ohm non-inductive termination resistor. The dotted line characteristic curve A represents the measurements of a conventional noise filter A commercially available from TDK Corporation as model number ZBF253D-01. Noise filter A includes a series inductor (L) on a bead core and shunt Mylar capacitor (C) of approximately 0.01 $\mu$F connected as shown in FIG. 1. That device measures 4.8 mm high by 6 mm and 3 mm in long and short diameters, respectively. Also, the dotted line characteristic curve B represents the measurements of a prior art noise filter B of the Kakutani or Nakamura type including an electrically conductive aluminum band 12 mm wide and approximately 55 $\mu$m thick wound 16 turns to obtain essentially the same capacitance value ($\simeq$0.01 $\mu$F) as that of sample A.

Represented by the characteristic curve C is the measurements of a first embodiment of the noise filter according to the present invention with a 12 mm wide, approximately 55 $\mu$m thick aluminum foil for electrically conductive band 6 and a 12 mm wide, approximately 20 $\mu$m thick iron foil for electromagnetically conductive band 9, both wound 17 turns with an appropriate insulative separator 11 to obtain essentially the same capacitance value ($\simeq$0.01 $\mu$F) as that of sample A. Also, represented by the solid line characteristic curve D is the characteristic curve of the second embodiment of the noise filter according to this invention using 12 mm wide, approximately 20 $\mu$m iron foils for both bands 6 and 9, wound 17 turns with an appropriate insulative separator 11 to obtain about 0.01 $\mu$F of capacitance.

It is apparent from the characteristic curve in FIG. 5 that the attenuation factor of the sample A is the lowest of the four samples at low and high frequencies. Both characteristic curves C and D are generally higher than those of the prior art noise filters at nearly all frequencies.

Various samples with different parameters were made and tested to further demonstrate the advantages of the present invention in contrast to the prior art noise filters. The tested samples are as follows:

SAMPLE A

This is the same as the aforementioned sample A, or the commerically available noise filter ZBF253D-01 from TDK Corporation.

SAMPLE B

A pair of non-magnetic, electrically conductive bands which were 12 mm wide, 20 $\mu$m thick wound in a tubular form with a pair of 15 mm wide, 57 $\mu$m thick Mylar tapes leaving an air core of 4 mm in diameter in the center. Three samples, B-1, B-2 and B-3, using a pair of 50 cm, 100 cm and 150 cm long aluminum foils wound 17, 28 and 38 turns, respectively were tested.

SAMPLE C

A 12 mm wide, 20 $\mu$m thick aluminum foil and iron foil of the same size were used as electrically conductive and electromagnetically conductive bands 6 and 9. Both bands were wound in a tubular form with a pair of 15 mm wide, 57 $\mu$m thick Mylar tapes therebetween leaving an air core of 4 mm in diameter in the center. Three samples, C-1, C-2 and C-3, using 50 cm, 100 cm and 150 cm long aluminum and iron foils wound 17, 28 and 38 turns, respectively were tested.

SAMPLE D

A pair of 12 mm wide, 20 $\mu$m thick iron foils were used as electromagnetically conductive foils 6 and 9 wound in a tubular form with a pair of 15 mm wide, 57

μm thick Mylar tapes therebetween leaving an air core of 4 mm in diameter in the center. Three samples, D-1, D-2 and D-3, using 50 cm, 100 cm and 150 cm long iron coils wound 17, 28 and 38 turns, respectively were tested.

Various electrical characteristics of these samples B, C and D are given in TABLE 1.

As is apparent from the data in TABLE 1, both the inductance and the Q factor of samples C and D, using electromagnetically conductive films for at least one of the conductive bands 9 and 6, are larger than those characteristics of the prior art noise filters (samples B) using only aluminum foil. However, the capacitance remains substantially unchanged.

Figure 6:
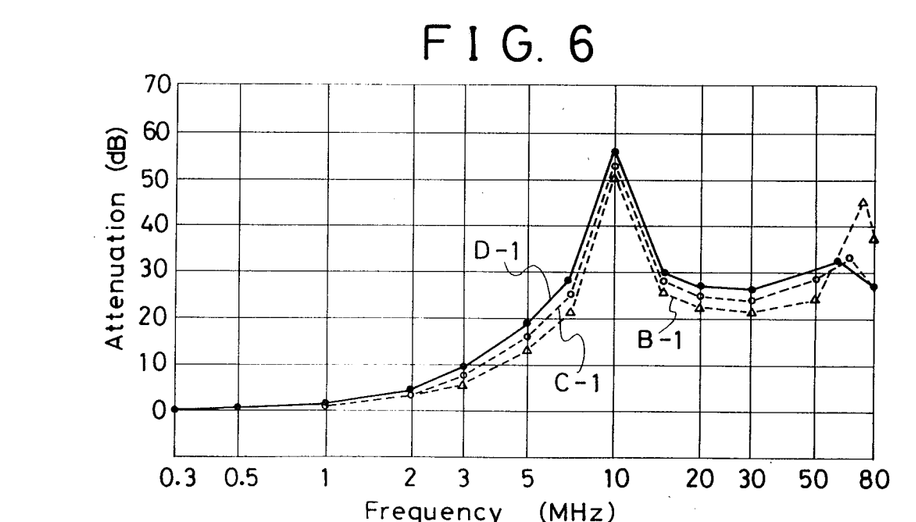
Figure 7:
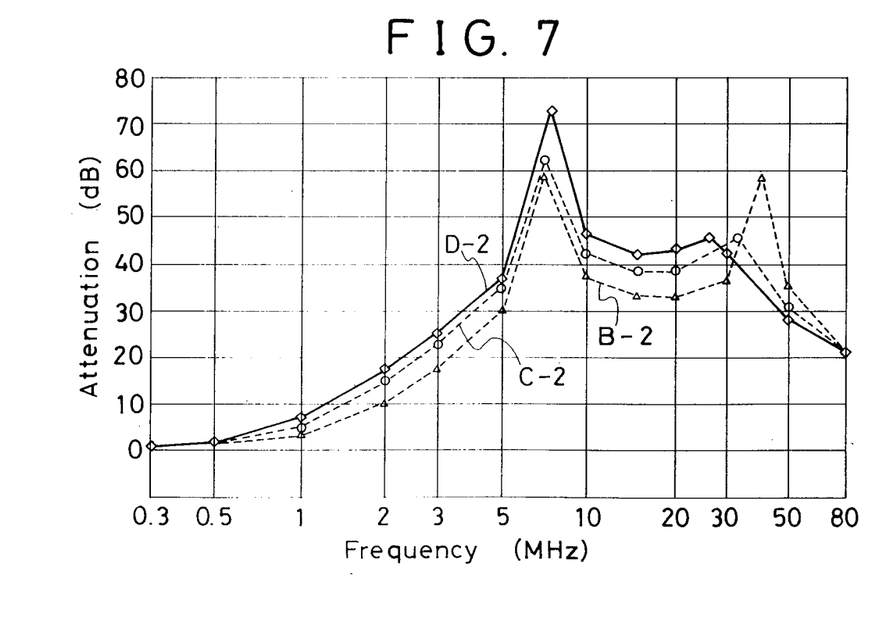
Figure 8:
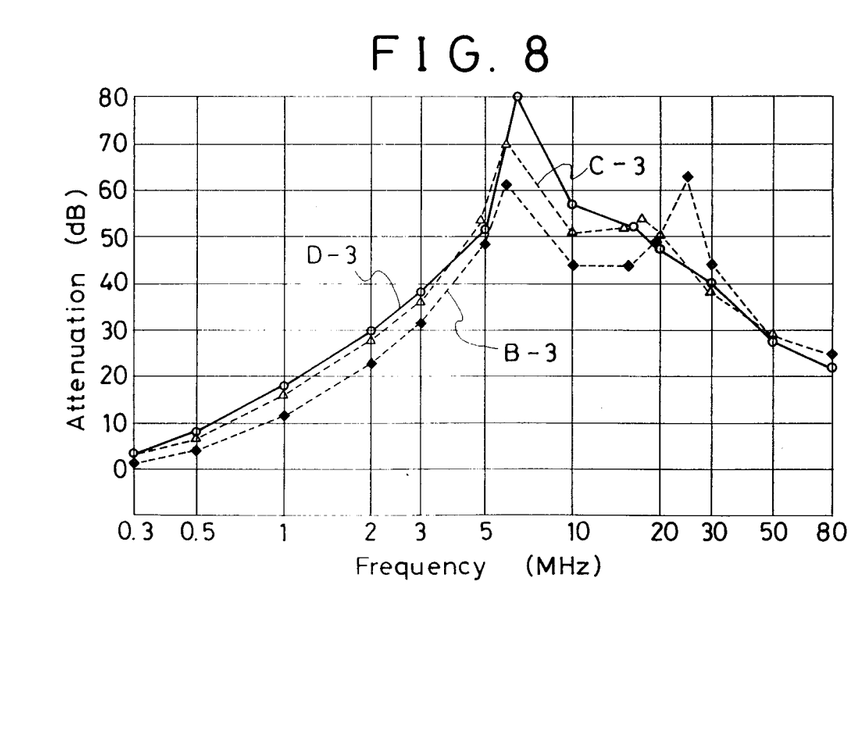

The measurements of frequency-attenuation characteristics of these samples are shown in FIGS. 6 through 8, wherein the sample reference number of the aforementioned samples are shown in the drawing.

It should be recognized that the samples have essentially the same number of turns of the windings and the same size. Therefore, the differences in electrical performance are mainly contributed by the differences in materials of the conductive bands 6 and 9. As can be seen in FIGS. 6-8, the two embodiments according to this invention (samples C and D) are generally superior in noise suppression performance over the majority of the frequency range, with sample D being the best.

TABLE 1

| Samples | Material and Size of Foils and Insulators | | Turns (Length) | Inductance (μH) | Capacitance (μF) | Q |
| --- | --- | --- | --- | --- | --- | --- |
| B-1 | Thickness: Width: | 20 μm 12 mm | 17 (50 cm) | 1.6 | 0.0038 | 0.07 |
| B-2 | Aluminium/ Aluminium Insulator: | Mylar | 28 (100 cm) | 4.6 | 0.0077 | 0.14 |
| B-3 | Thickness: Width: | 57 μm 15 mm | 38 (150 cm) | 9.0 | 0.0191 | 0.22 |
| C-1 | Thickness: Width: | 20 μm 12 mm | 17 (50 cm) | 3.8 | 0.0038 | 0.18 |
| C-2 | Aluminium/ Iron Insulator: | Mylar | 28 (100 cm) | 11.5 | 0.0079 | 0.37 |
| C-3 | Thickness: Width: | 57 μm 15 mm | 38 (150 cm) | 24.6 | 0.0187 | 0.59 |
| D-1 | Thickness: Width: | 20 μm 12 mm | 17 (50 cm) | 5.0 | 0.0038 | 0.11 |
| D-2 | Iron/Iron Insulator: | Mylar | 28 (100 cm) | 15.0 | 0.0081 | 0.18 |
| D-3 | Thickness: Width: | 57 μm 15 mm | 38 (150 cm) | 28.5 | 0.0176 | 0.23 |

Note:
Inductance, capacitance and Q factor are measured at 1 kHz.

Figure 9:
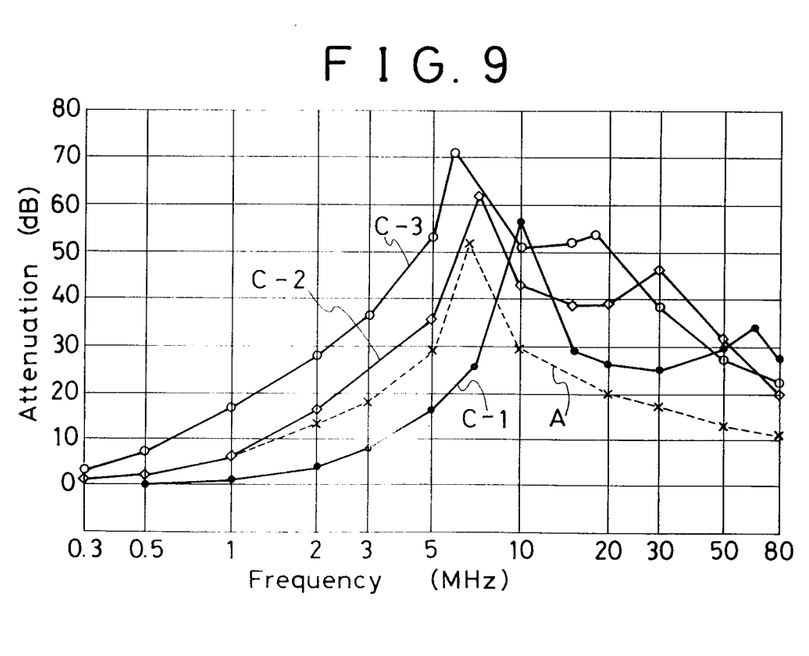
FIGS. 9 and 10 are attenuation characteristic curves of various samples of noise filters of the present invention showing the variation in performance for various inductance/capacitance combinations in comparison with a prior art noise filter.
Figure 10:
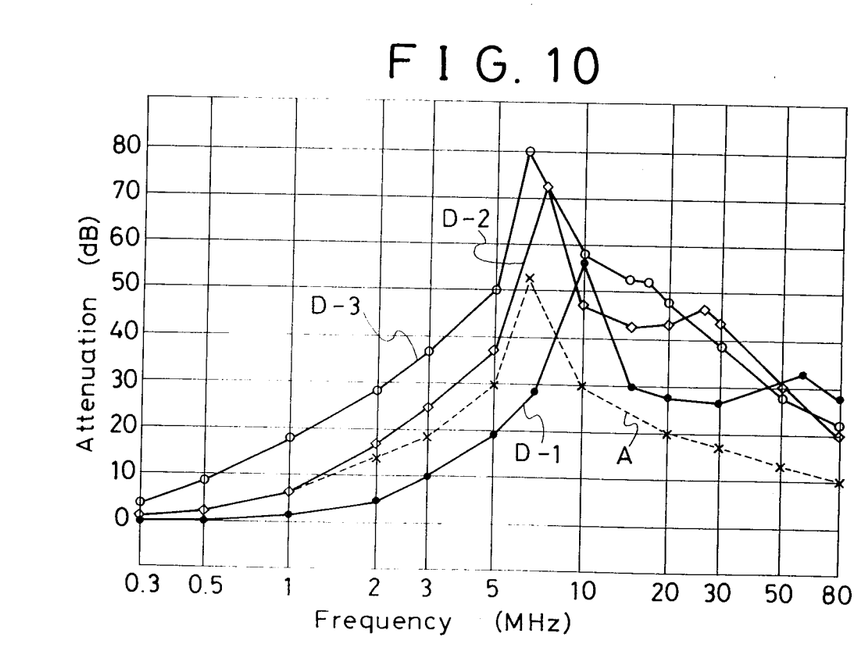

Shown in FIGS. 9 and 10 are each characteristic curves of the samples C-1, C-2 and C-3, and D-1, D-2 and D-3, respectively, in comparison with sample A. From these graphs the effect of noise suppression due to different turns of the winding is apparent. It can be said that the noise filter performance over a wide frequency range improves as the number of turns increases, and that the difference is significant at low frequencies. That is, the attenuation factor of the filter with a larger number of turns increases at low frequencies.

Although only preferred embodiments of this invention have been described and demonstrated, the scope of this invention is by no means limited to such embodiments. A person skilled in the art can easily modify this invention for his or her particular applications without departing from the scope of this invention. For example, the width of the conductive bands and the thickness of he insulative separators can be chosen as dictated by the current value flowing through the coil and the voltage applied thereto. The electromagnetically conductive film may be amorphous iron or mumetal, or a lamination of electrically conductive and magnetically conductive layers. The noise filters find wide applications and more than one filter can be connected in cascade to provide higher noise attenuation. Such cascaded noise filters may also be integrated into a single device by a simple extension of the present invention. Therefore, such changes and modifications are within the scope of this invention and the protection afforded this invention is only limited by the scope of the following claims.

I claim as my invention:

1. A noise filter comprising:
    a first foil layer of an electrically conductive material of a selected length;
    a second foil layer of an electromagnetically conductive material of substantially the same selected length as the first foil layer;
    first terminal means for conductively connecting to substantially each end of the first foil layer, said first terminal means disposed to be the input and output terminals of the filter;
    second terminal means for conductively connecting to the second foil layer, said second terminal means disposed to be connected to ground;
    a first insulative layer, substantially the same selected length of said first foil layer, disposed intermediate the first and second foil layers; and
    a second insulative layer, substantially the same selected length as said first foil layer, disposed on the other side of one of the first and second foil layers from the first insulative layer;
    said first and second foil layers and said first and second insulative layers being wound in a spiral with the ends of the four layers substantially in alignment.

2. A noise filter as in claim 1 where in said second foil layer is made of an iron foil.

3. A noise filter as in claim 1 wherein said second foil layer is wider than said first foil layer.

4. A noise filter as in claim 1 wherein the spiral of the first and second foil layers and the insulation layer is tubular in form with an oval cross section.

5. A noise filter as in claim 1 wherein said first foil layer is also electromagnetically conductive.

6. A noise filter as in claim 1 wherein the series inductance component of the filter is determined by the relative widths of the first and second foil layers one to the other.

7. A method for constructing a noise filter comprising the steps of:
    a. affixing lead wires to substantially each end of an electrically conductive film of a selected length;
    b. affixing a lead wire to an electromagnetically conductive film of substantially the same length as the electrically conductive film;
    c. creating a four layer lamination of said electrically and electromagnetically conductive films and two insulative films, each of said insulative films being substantially as long as the electrically conductive film with one of the insulative films disposed intermediate the electrically and electromagnetically conductive films, the other of the insulative films disposed on the other side of one of the electrically and electromagnetically conductive films from said one insulative film, and the ends of the four films being substantially in alignment;

d. winding the lamination of step c. in a spiral manner; and e. applying a protective layer to the filter assembly.

8. A method of making the noise filter as in claim 7 further including a step of:

f. pressing said wound lamination of step d. into an oval cross section before step e.

9. A method of making the noise filter as in claim 7, wherein said electrically conductive film is also electromagnetically conductive.

* * * * *